(12) United States Patent
Shiu et al.

(10) Patent No.: US 6,392,572 B1
(45) Date of Patent: May 21, 2002

(54) BUFFER ARCHITECTURE FOR A TURBO DECODER

(75) Inventors: Da-shan Shiu, San Jose; Iwen Yao, San Diego, both of CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/854,278

(22) Filed: May 11, 2001

(51) Int. Cl.$^7$ ................................................ H03M 7/00
(52) U.S. Cl. ....................................................... 341/81
(58) Field of Search .............................. 341/81, 82, 83; 375/341; 714/755

(56) References Cited

U.S. PATENT DOCUMENTS 6,223,319 B1 * 4/2001 Ross .......................... 714/755
6,307,901 B1 * 10/2001 Yu et al. ..................... 375/341

OTHER PUBLICATIONS

Steven S. Pietrobon Implementation and Performance of a Turbo/map Decoder<' International Journal of Satellite Communications, Int. J. Satell. Commun., 16, 23–46 (1998).

* cited by examiner

Primary Examiner—Brian Young
(74) Attorney, Agent, or Firm—Philip Wadsworth; Kent D. Baker; S. Hossain Beladi

(57) ABSTRACT

A buffer structure for storing intermediate results (i.e., APP data) for a Turbo decoder to increase access throughput, the buffer structure is designed to support concurrent access of APP data for two or more bits for each access cycle. This is achieved by partitioning the buffer into a number of banks, with each bank being independently accessible. To avoid access contentions, the banks are assigned to the rows and columns of a 2-dimensional array used for code interleaving such that APP data for consecutive bits are accessed from different banks. To support "linear" addressing, the banks can be arranged into two sets, which are assigned to even-numbered and odd-number columns of the array. To support "interleaved" addressing, the banks can be assigned to groups of rows of the array such that adjacent rows in the interleaved array are assigned to different groups.

23 Claims, 9 Drawing Sheets

BUFFER ARCHITECTURE FOR A TURBO DECODER

BACKGROUND

I. Field

The present invention relates to data communication. More particularly, the present invention relates to a novel and improved buffer structure for storing intermediate results for a Turbo decoder.

II. Background

Wireless communication systems are widely deployed to provide various types of communication such as voice, data, and so on. These systems may be based on code division multiple access (CDMA), time division multiple access (TDMA), or some other multiple access techniques. A CDMA system provides certain advantages over other types of system, including increased system capacity.

A CDMA system may be designed to support one or more CDMA standards such as (1) the "TIA/EIA-95-B Mobile Station-Base Station Compatibility Standard for Dual-Mode Wideband Spread Spectrum Cellular System" (the IS-95 standard), (2) the "TIA/EIA-98-D Recommended Minimum Standard for Dual-Mode Wideband Spread Spectrum Cellular Mobile Station" (the IS-98 standard), (3) the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (the W-CDMA standard), (4) the standard offered by a consortium named "3rd Generation Partnership Project 2" (3GPP2) and embodied in a set of documents including Document Nos. C.S0002-A, C.S0005-A, C.S0010-A, C.S0011-A. C.S0024, and C.S0026 (the cdma2000 standard), and (5) some other standards. These standards are incorporated herein by reference.

Each standard specifically defines the processing of data for transmission on the forward and reverse links. For example, speech information may be coded at a particular data rate, formatted into a defined frame format, and processed (e.g., encoded for error correction and/or detection, interleaved, and so on) in accordance with a particular processing scheme. The frame formats and processing defined by a particular standard (e.g., cdma2000 standard) are likely to be different from those of other standards (e.g., W-CDMA standard).

The W-CDMA standard supports flexible operation. For example, data may be transmitted in bursts and over one or more "physical" channels, the data rate may be allowed to vary from frame to frame, the processing of the data may also vary (e.g., from frame to frame and/or from "transport" channel to channel), and so on.

The W-CDMA standard employs a parallel concatenated convolutional encoder (often referred to as a Turbo encoder), which may be selected for encoding a code segment (i.e., a data packet) prior to transmission. The Turbo encoder employs two constituent encoders operated in parallel and in combination with a code interleaver. The code interleaver shuffles (i.e., interleaves) the information bits in the packet in accordance with a specifically defined interleaving scheme. One encoder encodes the information bits in the packet to generate a first sequence of parity bits, and the other encoder encodes the shuffled information bits to generate a second sequence of parity bits. The information bits and all or some of the parity bits in the first and second sequences are transmitted.

Complementary (and computationally intensive) Turbo decoding is performed at a receiver unit. For each Turbo encoded packet, the received bits are stored to a buffer. The information and parity bits for the first encoder are then retrieved from the buffer and decoded based on the first constituent code to provide "extrinsic" information indicative of adjustments in the confidence in the detected values for the information bits. Intermediate results that include the extrinsic information from the first decoder are then stored to a storage unit in an interleaved order matching the code interleaving used at the transmitter unit.

The intermediate results and the parity bits from the second encoder are then retrieved from their respective sources and decoded based on the second constituent code to provide extrinsic information indicative of further adjustments in the confidence in the detected values for the information bits. Intermediate results that comprise the extrinsic information from the second decoder are then stored to the storage unit in a deinterleaved order complementary to the code interleaving used at the transmitter unit. The intermediate results are used by the next iteration of the first constituent decoder. The decoding by the first and second constituent decoders is iterated a number of times to yield the final results.

For each information bit to be decoded, the storage unit is accessed to retrieve intermediate result generated for this bit by a prior decoding (if any). The intermediate result generated for each decoded bit is also stored back to the storage unit for use in a subsequent decoding. The storage unit is thus continually accessed as bits in the packet are decoded. Efficient memory management is essential for efficient Turbo decoding.

As can be seen, a buffer structure that may be used to efficiently store intermediate results for a Turbo decoder is highly desirable.

SUMMARY

Aspects of the present invention provide a buffer structure that may be used to efficiently store intermediate results (e.g., a priori probability (APP) data) for a Turbo decoder. To increase access throughput of APP data during Turbo decoding, the buffer structure is designed to support concurrent access (i.e., write or read) of APP data for two or more information bits for each access cycle. The APP data for each bit is representative of either a combination of an information bit and its extrinsic information or just the extrinsic information for the bit. The concurrent access can be achieved by partitioning the buffer into a number of banks, with each bank being independently accessible. For example, six or more banks may be used for a Turbo decoder used in a W-CDMA system.

A Turbo encoder employs a code interleaving scheme to shuffle the information bits in a data packet prior to encoding by a second constituent encoder. The code interleaving scheme typically specifies (1) writing the information bits in a data packet (or code segment) row-by-row into a 2-dimensional array, (2) shuffling the elements within each row, and (3) shuffling the rows. The bits are thereafter read column-by-column from the array. The same interleaving scheme and a complementary deinterleaving scheme are used for storing/retrieving the APP data for the Turbo decoder.

For Turbo decoding, the APP data may be accessed via an "interleaved" addressing mode or a "linear" addressing mode. The interleaved addressing mode corresponds to access of APP data at "interleaved" locations in a data packet, and the linear addressing mode corresponds to access of APP data at "linear" locations in the packet. To avoid access contentions, the banks are assigned to the rows and columns of the array such that APP data for consecutive bits to be (accessed via either linear or interleaved addressing mode) are from different banks.

To ensure that two different banks are accessed for APP data for two consecutive bits in the linear addressing mode, the banks can be arranged and assigned such that one set of banks is used for even-numbered columns of the array, and another set of banks is used for odd-numbered columns. With this odd/even assignment scheme, consecutive linear addresses are associated with two different sets of banks.

To ensure that two different banks are accessed for APP data for two consecutive bits in the interleaved addressing mode, the banks can be assigned to groups of rows in the array. Since the bits for the data packet are retrieved column-by-column from the array in the interleaved addressing mode, the rows can be arranged into groups such that adjacent rows for the interleaved addressing mode are assigned to different groups. The grouping of the rows is typically dependent on the one or more permutation patterns used to shuffle the rows. The row grouping is described in further detail below.

Various aspects, embodiments, and features of the invention are described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION

Figure 1:
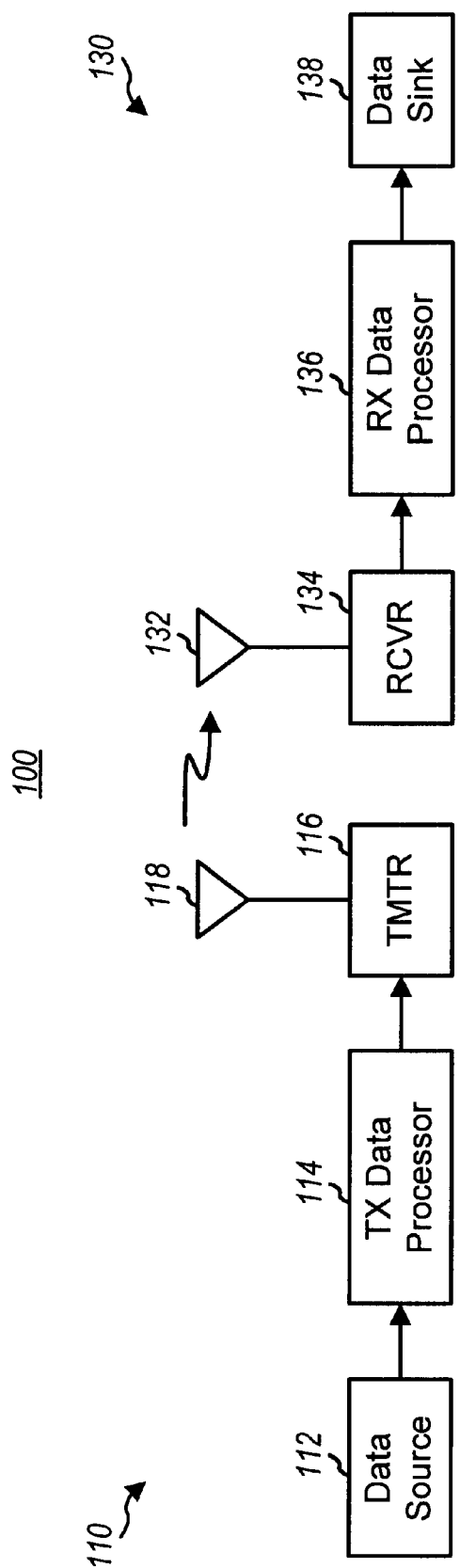
FIG. 1 is a simplified block diagram of a communication system capable of implementing various aspects of the invention.

FIG. 1 is a simplified block diagram of a communication system 100 capable of implementing various aspects of the invention. In a specific embodiment, communication system 100 is a CDMA system that conforms to the W-CDMA standard. At a transmitter unit 110, data is sent, typically in blocks, from a data source 112 to a transmit (TX) data processor 114 that formats, codes, and processes the data to generate one or more analog signals. The analog signals are then provided to a transmitter (TMTR) 116 that (quadrature) modulates, filters, amplifies, and upconverts the signal(s) to generate a modulated signal. The modulated signal is then transmitted via one or more antennas 118 (only one is shown in FIG. 1) to one or more receiver units.

At a receiver unit 130, the transmitted signal is received by one or more antennas 132 (again, only one is shown) and provided to a receiver (RCVR) 134. Within receiver 134, the received signal(s) are amplified, filtered, downconverted, (quadrature) demodulated, and digitized to generate samples. The samples are then processed and decoded by a receive (RX) data processor 136 to recover the transmitted data. The processing and decoding at receiver unit 130 are performed in a manner complementary to the processing and coding performed at transmitter unit 110. The recovered data is then provided to a data sink 138.

The signal processing described above supports transmissions of voice, video, packet data, messaging, and other types of communication in one direction. A bi-directional communication system supports two-way data transmission. However, the signal processing for the other direction is not shown in FIG. 1 for simplicity.

Figure 2A:
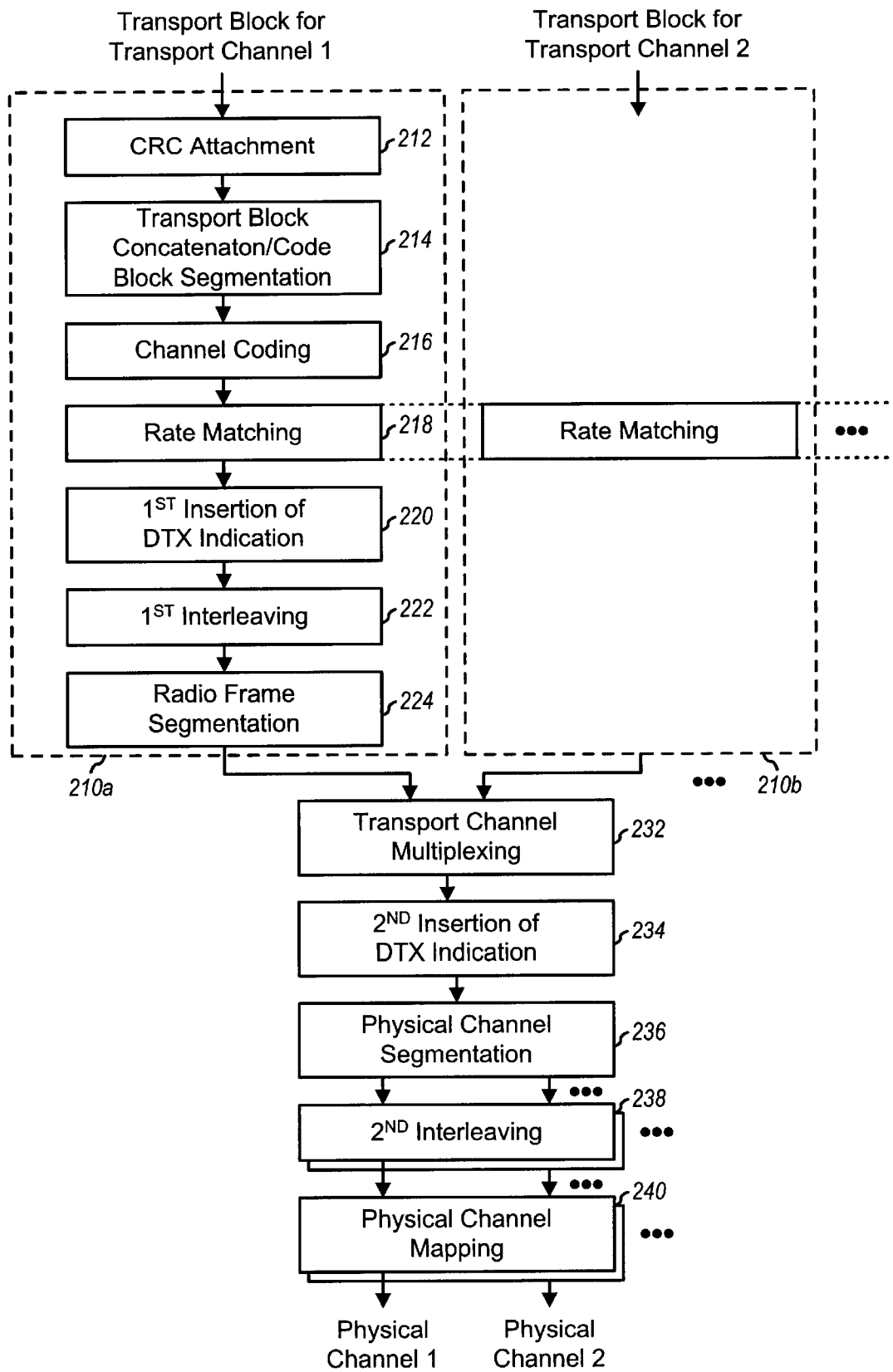
FIGS. 2A and 2B are diagrams of the signal processing at a transmitter unit and a receiver unit, respectively, for a downlink data transmission in accordance with the W-CDMA standard.

FIG. 2A is a diagram of the signal processing at transmitter unit 110 for a downlink data transmission in accordance with the W-CDMA standard. The downlink refers to transmission from a base station to a user terminal (or user equipment (UE)), and the uplink refers to transmission from the user terminal to the base station. The signal processing shown in FIG. 2A is generally performed by transmit data processor 114 in FIG. 1. The upper signaling layers of the W-CDMA system support concurrent transmission of a number of transport channels, with each transport channel capable of carrying data for a particular communication (e.g., voice, video, data, and so on). The data for each transport channel is provided, in blocks that are also referred to as transport blocks, to a respective transport channel processing section 210.

Within transport channel processing section 210, each transport block is used to calculate cyclic redundancy check (CRC) bits, in block 212. The CRC bits are attached to the transport block and used at the receiver unit for error detection. A number of CRC coded blocks are then serially concatenated together, in block 214. If the total number of bits after concatenation is greater than the maximum size of a code block, the bits are segmented into a number of (equal-sized) code blocks. Each code block is then coded with a particular coding scheme (e.g., a convolutional code, a Turbo code) or not coded at all, in block 216.

Rate matching is then performed on the code bits, in block 218. Rate matching is performed in accordance with a rate-matching attribute assigned by higher signaling layers. On the uplink, bits are repeated or punctured (i.e., deleted) such that the number of bits to be transmitted matches the number of bits available. On the downlink, unused bit positions are filled with discontinuous transmission (DTX) bits, in block 220. The DTX bits indicate when a transmission should be turned off and are not actually transmitted.

The bits are then interleaved in accordance with a particular interleaving scheme to provide time diversity, in block 222. In accordance with the W-CDMA standard, the time interval over which interleaving is performed can be selected from a set of possible time intervals (i.e., 10 msec, 20 msec, 40 msec, or 80 msec). The interleaving time interval is also referred to as a transmission time interval (TTI). The TTI is an attribute associated with each transport channel and, in accordance with the W-CDMA standard, does not change for the duration of a communication session. As used herein, a "traffic" comprises the bits within one TTI for a particular transport channel.

When the selected TTI is longer than 10 msec, the traffic is segmented and mapped onto consecutive transport channel radio frames, in block 224. Each transport channel radio frame corresponds to a transmission over a (10 msec) radio frame period. In accordance with the W-CDMA standard, a traffic may be interleaved over 1, 2, 4, or 8 radio frame periods.

The radio frames from all active transport channel processing sections 210 are then serially multiplexed into a coded composite transport channel (CCTrCH), in block 232. DTX bits may then be inserted to the multiplexed radio frames such that the number of bits to be transmitted matches the number of bits available on the physical channel (s) used for the data transmission, in block 234. If more than one physical channel is used, the bits are segmented among the physical channels, in block 236. A particular physical channel can carry transport channels having different TTIs. The bits in each radio frame period for each physical channel are then interleaved to provide additional time diversity, at block 238. The interleaved physical channel radio frames are then mapped to their respective physical channels, at block 240. The subsequent signal processing to generate a modulated signal suitable for transmission to a user terminal is known in the art and not described herein.

Figure 2B:
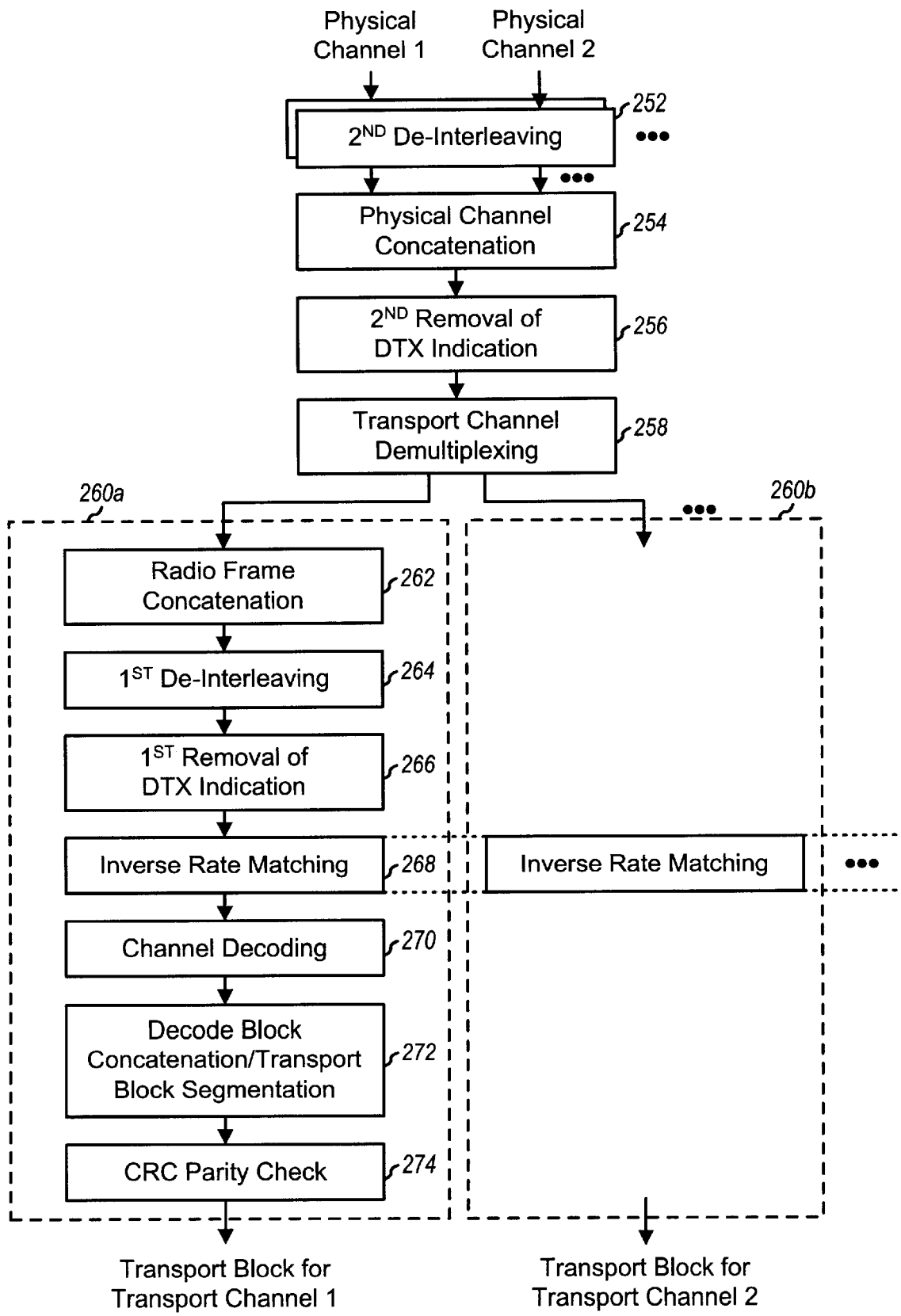

FIG. 2B is a diagram of the signal processing at receiver unit 130 for a downlink data transmission in accordance with the W-CDMA standard. The signal processing shown in FIG. 2B is complementary to that shown in FIG. 2A, and is generally performed by receive data processor 136 in FIG. 1. Initially, the modulated signal is received, conditioned, digitized, and processed to provide symbols for to each physical channel used for the data transmission. Each symbol has a particular resolution (e.g., 4 bits or more) and corresponds to a transmitted bit. The symbols in each radio frame period for each physical channel are de-interleaved, in block 252, and the de-interleaved symbols from all physical channels are concatenated, in block 254. For a downlink transmission, non-transmitted bits are detected and removed, in block 256. The symbols are then demultiplexed into various transport channels, in block 258. The radio frames for each transport channel are then provided to a respective transport channel processing section 260.

Within transport channel processing section 260, the transport channel radio frames are concatenated into traffic channel, in block 262. Each traffic channel includes one or more transport channel radio frames and corresponds to a particular TTI used at the transmitter unit. The symbols within each traffic channel are de-interleaved, in block 264, and non-transmitted symbols are removed, in block 266. Inverse rate matching is then performed to accumulate repeated symbols and insert "don't cares" for punctured symbols, in block 268. Each coded block in the traffic channel is then decoded, in block 270. The decoded blocks are then concatenated and segmented into their respective transport blocks, in block 272. Each transport block is then checked for error using the CRC bits, in block 274.

Figure 3:
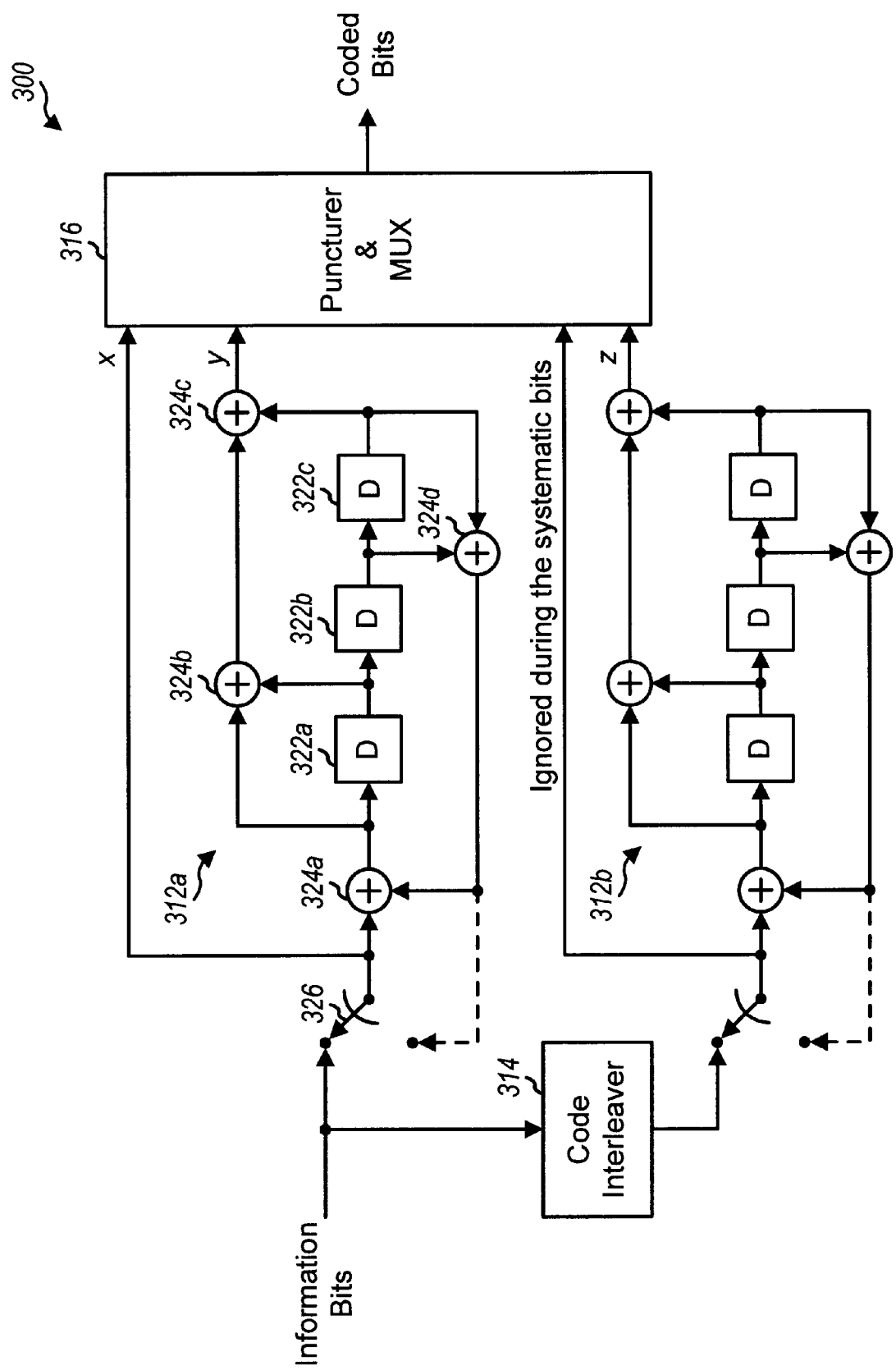
FIG. 3 is a diagram of a Turbo encoder defined by the W-CDMA standard.

FIG. 3 is a diagram of a parallel concatenated convolutional encoder 300 (which is also referred to as a Turbo encoder) defined by the W-CDMA standard. Turbo encoder 300 may be used to perform the channel coding in block 216 in FIG. 2A. Turbo encoder 300 includes a pair of constituent encoders 312a and 312b, a code interleaver 314, and a puncturer and multiplexer 316. Code interleaver 314 receives and interleaves the information bits in a code segment (i.e. a packet) in accordance with a particular interleaving scheme defined by the W-CDMA standard and described in further detail below.

Each constituent encoder 312 receives either linear-order or interleaved information bits, encodes the received information bits with a defined constituent code, and provides a sequence of parity bits. Puncturer and multiplexer 316 receives the information bits and the parity bits from both encoders 312a and 312b, punctures (i.e. deletes) zero or more parity bits to obtain the desired number of bits, and multiplexes the unpunctured information and parity bits into a sequence of coded bits.

Each constituent encoder 312 includes three series-coupled delay elements 322, four modulo-2 adders 324, and a switch 326. Initially, the states of delay elements 322 are set to zeros and switch 326 is in the up position. Then, for each information bit in the data packet, adder 324a performs modulo-2 addition of the information bit x with the output bit from adder 324d and provides the result to delay element 322a. Adders 324b and 324c receive and perform modulo-2 addition of the bits from adder 324a and delay elements 322a and 322c, and provide the parity bit y. Adder 324d performs modulo-2 addition of the bits from delay elements 322b and 322c.

After all N information bits in the data packet have been encoded, switch 326 is moved to the down position and three zero ("0") tail bits are provided to constituent encoder 312a. Constituent encoder 312a then encodes the three tail bits and provides six tail parity bits.

For each packet of N information bits, constituent encoder 312a provides N parity bits y and the first six tail parity bits, and constituent encoder 312b provides N parity bits z and the last six tail parity bits. For each packet, puncturer and multiplexer 316 receives N information bits, N+6 parity bits from encoder 312a, and N+6 parity bits from encoder 312b. Puncturer and multiplexer 316 may puncture a number of parity bits to provide the required number of coded bits, which comprises the unpunctured information and parity bits.

Figure 4:
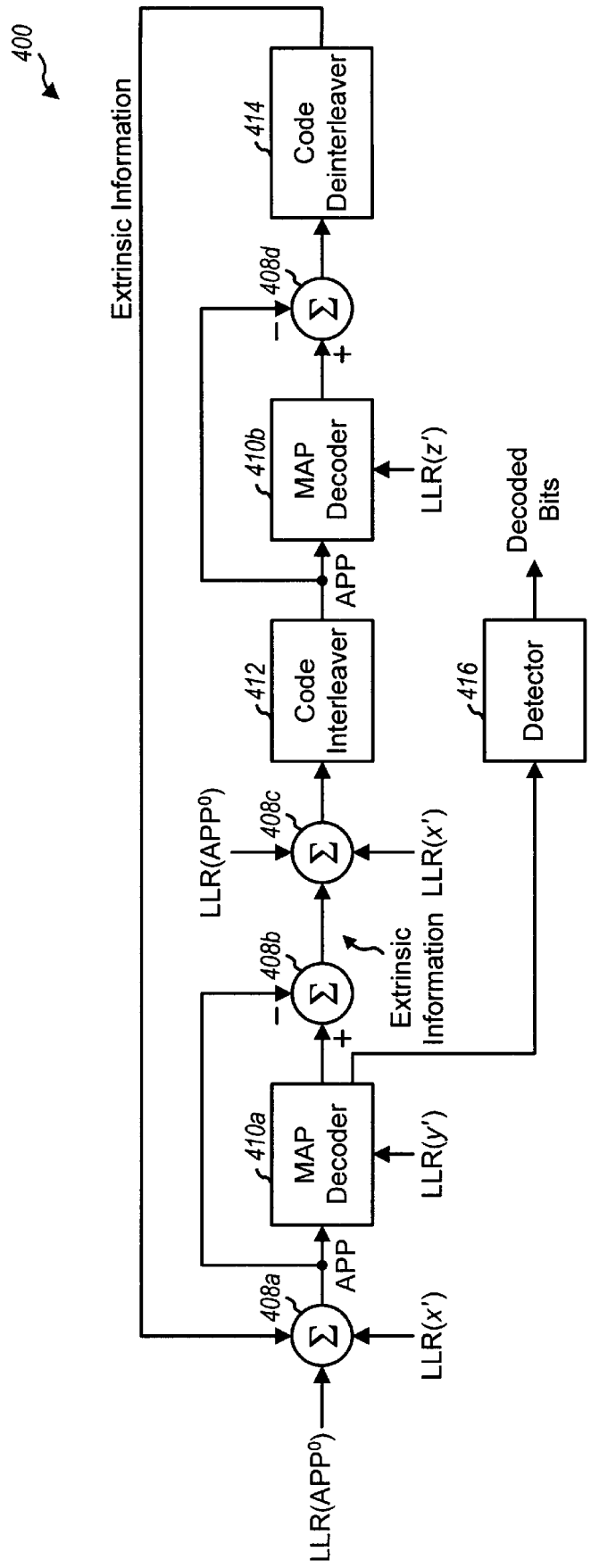
FIG. 4 is a block diagram of a design of a Turbo decoder.

FIG. 4 is a block diagram of a design of a Turbo decoder 400. In this design, Turbo decoder 400 includes two constituent decoders 410a and 410b, a code interleaver 412, a code deinterleaver 414, and a detector 416. Each decoder 410 is typically implemented as a soft-input/soft-output (SISO) maximum a posteriori (MAP) decoder. However, other types of decoders may also be used, such as a decoder that implements the soft output Viterbi algorithm (SOVA). The design of the decoder is typically dependent on the particular Turbo coding scheme used at the transmitter unit.

The received (soft) bits corresponding to the transmitted coded bits are deinterleaved by a channel deinterleaver (not shown in FIG. 4) to undo the first and second interleaving performed at the transmitter unit (blocks 222 and 238 in FIG. 2A). For each data packet to be decoded, the channel-deinterleaved bits are provided to decoders 410a and 410b as needed.

In the embodiment shown in FIG. 4, a summer 408a receives and sums LLR($APP^0$), LLR(x'), and the extrinsic information from deinterleaver 414 to provide a priori probabilities (APP) for decoder 410a. LLR($APP^0$) is the log likelihood ratio derived from an underlying assumption of the information bits. If each information bit in a data packet is assumed to be equally likely to be either zero (37 0") or one ("1"), then LLR($APP^0$) is equal to zero for all received bits in the packet, and any parts related to LLR($APP^0$) are ignored. The extrinsic information from deinterleaver 414 is set to zero for the first decoding iteration. LLR(x') is the log-likelihood ratio of the received information bits x'. The LLR of each received information and parity bit, $b_m$, can be computed as:

$$LLR(b_m) = \log\left(\frac{P(b_m = 0)}{P(b_m = 1)}\right).$$

The LLR of a received bit is the logarithm of the ratio of the probability of the bit being a zero over the probability of the bit being a one. The probabilities, $P(b_m=0)$ and $P(b_m=1)$, for each received bit are typically based on the soft value for that bit. The LLR for an erasure (i.e., punctured bit) is indicative of equal confidence in the bit being a zero or a one (i.e., LLR=0).

Decoder 410a receives the APP from summer 408a and LLR(y'), which are the LLRs of the received parity bits, y', from the first constituent encoder. LLR(y') includes erasures for punctured (i.e. non-transmitted) parity bits, if any. Decoder 410a then decodes the APP and LLR(Y') in accordance with the MAP algorithm to generate a posteriori probabilities. The APP is then subtracted from the a posteriori probabilities by a summer 408b to provide extrinsic information, $e_1$, which is indicative of corrections/adjustments in the confidence of the values for the received information bits x' contributed by the received parity bits y'.

The extrinsic information, $e_1$, from summer 408b is summed with the information bit LLRs, LLR(x'), and the intermediate results (which are APP for the next decoder) are stored to code interleaver 412. Code interleaver 412 implements the same code interleaving scheme used at the Turbo encoder (e.g., the same scheme used for code interleaver 314 in FIG. 3).

Decoder 410b receives the interleaved APP from interleaver 412 and LLR(z'), which are the LLRs of the received parity bits, z', from the second constituent encoder. Decoder 410b then decodes the APP and LLR(z') in accordance with the MAP algorithm to generate a posteriori probabilities. The APP is then subtracted from the a posteriori probabilities by a summer 408d to provide extrinsic information, $e_2$, which is indicative of further corrections/adjustments in the confidence of the values for the received information bits x' contributed by the received parity bits z'. The extrinsic information, $e_2$, comprises the intermediate results from decoder 410b, which are stored to code deinterleaver 414. Deinterleaver 414 implements a deinterleaving scheme complementary to the interleaving scheme used for interleaver 412.

The decoding of the information bit LLRs is iterated a number of times (e.g., 6, 8, 10, or possibly more times). With each iteration, greater confidence is gained for the detected values of the information bits. After all the decoding iterations have been completed, the final LLRs are provided to detector 418, which provides hard-decision values (i.e., "0s" and "1s") for the received information bits based on their LLRs.

Figure 5:
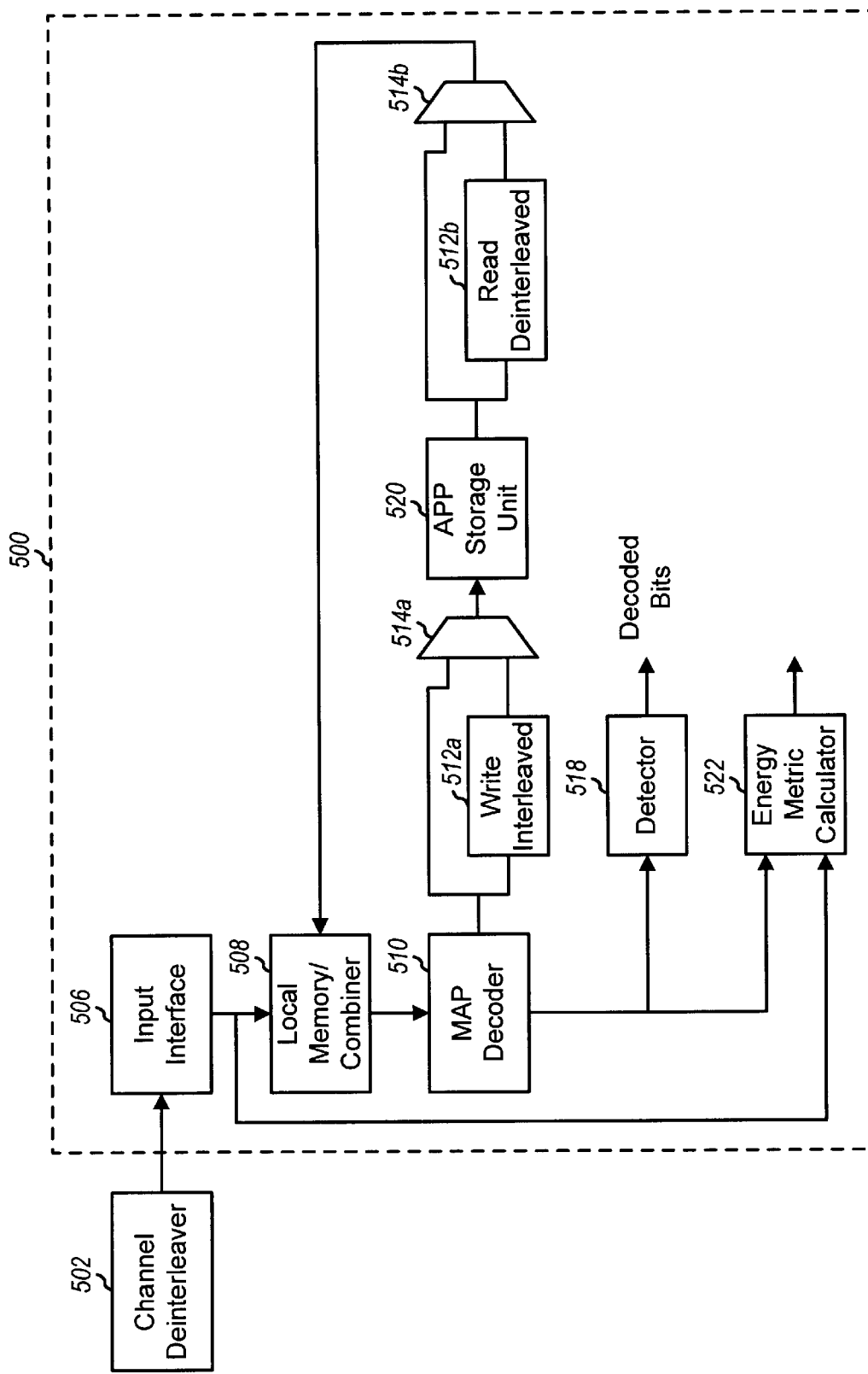
FIG. 5 is a block diagram of a Turbo decoder in accordance with an embodiment of the invention.

FIG. 5 is a block diagram of a Turbo decoder 500, in accordance with an embodiment of the invention. Turbo decoder 500 is one specific implementation of Turbo decoder 400 in FIG. 4. In this embodiment, Turbo decoder 500 includes an input interface unit 506, a local memory/combiner 508, a SISO MAP decoder 510, write/read interleaved/deinterleaved address generator 512a, a storage unit 520, a detector 518, and an energy metric calculator 522. Referring back to FIG. 4, the two constituent decoders 410a and 410b are operated in series, with the extrinsic information from one decoder being provided as an input to the other decoder. Because of the serial operation of the two constituent decoders, only one (physical) decoder can be used to implement both constituent decoders.

Input interface unit 506 provides the interface between a channel deinterleaver 502 and MAP decoder 510. For some systems, input interface unit 506 may be designed to provide de-puncturing of the coded bits, if puncturing was performed at the transmitter unit. The de-puncturing is achieved by providing an erasure for each punctured bit, with the erasure being indicative of equal likelihood of the bit being a zero or a one.

Depending on the particular decoding pass being performed (i.e., decoding for the first or second constituent encoder), the proper sequence of information and parity bits is provided to memory/combiner 508 from channel deinterleaver 502. APP obtained from the prior iteration is also provided to memory/combiner 508 from APP storage unit 520. In an embodiment, memory/combiner 508 is designed to (1) receive and compute LLR for the received (soft) information bits, (2) combine the LLR(x') computed in step (1) and the corresponding extrinsic information to generate APP, and (3) receive and compute LLR for the received parity bits.

In an embodiment, memory/combiner 508 is implemented using a sliding window architecture (SWA) that temporarily stores, e.g., four windows worth of information and parity bits. While three windows of information and parity bits are being operated on by three state metric calculators within decoder 510, the fourth window is updated with values from channel deinterleaver 502 and storage unit 520. In an embodiment, each window has a size of 32, i.e., each window holds 32 x' symbols and 32 y' (or z') symbols. Other window lengths and/or different number of windows may also be used, and this is within the scope of the invention.

In an embodiment, decoder 510 implements a SISO decoder that executes a log-MAP algorithm. Any MAP-based decoding algorithm (e.g., a max log-MAP algorithm or a max* log-MAP algorithm, both of which are known in the art) may also be used. In an embodiment, to implement the MAP algorithm, decoder 510 includes one forward state metric calculator and two backward state metric calculators. Each forward (or backward) state metric calculator computes the logarithm of the probability of each of $2^{K-1}$ states in the trellis at a given current time instance based on (1) the probabilities of the states at a previous (or future) time instance and (2) the probabilities of the path between the previous (or future) states and the state in the current time, where K is the constraint length of the constituent encoder. These forward and backward state metrics ($\alpha$ and $\beta$, respectively) are then used to compute a posteriori probabilities for the information bits. The forward and backward state metric calculations and Turbo decoding are described in greater detail by Steven S. Pietrobon in a paper entitled "Implementation and Performance of a Turbo/Map Decoder," International Journal of Satellite Communications, Vol. 16, 1998, pp. 23–46, which is incorporated herein by reference.

The sliding window architecture and the use of one forward and two backward state metric calculators reduce the storage requirement while only moderately increasing the amount of computation. A single backward state metric calculator can be operated from the end of a packet to the start of the packet in one pass, but this would require a large amount of storage space. In an embodiment, the following sequence of operations are executed for a particular decoding pass:

FWMC (1~32)
FWMC (33~64)
FWMC (65~96) and RWMC A (64~33)
FWMC (97~128) and RWMC A (32~1) and RWMC B (95~65)

FWMC (129~160) and RWMC B (64~33) and RWMC A (129~97)

FWMC (161~192) and RWMC A (96~65) and RWMC B (160~129)

where FWMC (1~132) represents a forward metric calculation for bits 1 through 32, and RWMC (32~1) represents a reverse metric calculation for bits 32 through 1. The result from the FWMC is combined with the underlined RWMC to form a posteriori probabilities, from which the APP symbols are subtracted to derive extrinsic information. The extrinsic information is combined with the information bit LLRs to form APP symbols for the next decoding stage.

The output of decoder 510 is stored to APP storage unit 520. In an embodiment, APP storage unit 520 is operated to store the APP symbols from decoder 510 in interleaved order (as oppose to linear order, which may also be used). Storing the intermediate results in interleaved order may simplify the partitioning of the memory and further allows for the use of the same interleaving address generator for both the Turbo encoder and decoder. In an embodiment, APP storage unit 520 is further operated to store APP symbols from the first constituent decoding and extrinsic information from the second constituent decoding.

For the first constituent decoding, extrinsic information from a previous second constituent decoding is retrieved from storage unit 520 in deinterleaved order, and APP symbols generated by the decoding are stored to storage unit 520 in interleaved order. Correspondingly, for the second constituent decoding, APP symbols from a previous first constituent decoding are retrieved from storage unit 520 in linear order, and extrinsic information generated by the decoding is stored to storage unit 520 in linear order.

Write/read address generator 512a respectively provide the write and read addresses for storage unit 520. Multiplexer 514a is symbolically shown in FIG. 5 to indicate that the APP symbols/extrinsic information may be written to storage unit 520 in linear or interleaved order, and multiplexer 514b is symbolically shown to indicate that the APP symbols/extrinsic information may be retrieved from the storage unit in linear or deinterleaved order.

Detector 518 receives the APP symbols after the last decoding iteration and provides hard decisions for the received information bits. Energy metric calculator 522 provides an energy metric for the information bits (or their LLRs). The energy metric may be used as another indication of the confidence in the detected information bits.

For the Turbo decoder designs shown in FIGS. 4 and 5, the storage unit stores APP data from the first constituent decoder and extrinsic information from the second constituent decoder. The APP data and extrinsic information are two different forms of intermediate results from the constituent decoder. As used herein, intermediate results can comprise any information that is passed from one constituent decoder to a subsequent decoder, and may take on any form. Typically, the particular form of intermediate results to be stored from any constituent decoder is dependent on the specific design of the Turbo decoder.

The code interleaving is an important and integral part of the Turbo encoder and decoder. Whatever scheme is selected for the code interleaving at the Turbo encoder, the same scheme is used to store/retrieve the APP symbols from the first constituent decoding, and a complementary scheme is used to store/retrieve the extrinsic information for the second constituent decoding.

The W-CDMA standard defines a specific interleaving scheme for the Turbo encoder. This interleaving scheme may be partitioned into three stages: (1) writing the information bits in a "code segment" row-by-row into an R×C array, (2) rearranging the elements within each row (i.e., intra-row permutation), and (3) interchanging the rows (i.e., inter-row permutation). The bits are thereafter read from the array column-by-column, starting with the upper left-most element in the R×C array. These three stages are described in further detail below, and an example is provided thereafter for a better understanding of the interleaving scheme.

In the first stage, the bits in each code segment are written into the R×C array. The W-CDMA standard supports code segments of various sizes ranging from 40 to 5114 bits. Initially, the number of rows, R, in the array is determined based on the size of the code segment, K, as follows:

R=5, if $40 \leq K \leq 159$;

R=10, if $160 \leq K \leq 200$ or $481 \leq K \leq 530$; or

R=20, for all other K.

The number of columns, C, in the array is next determined based on R and K, as follows:

C=53, if $481 \leq K \leq 530$; otherwise, select a prime number p such that $(p+1) \cdot R \geq K$, and then select C=min $\{p-1, p, p+1\}$ such that $R \cdot C \geq K$.

Once R and C are determined for a given K, the bits in the code segment are written row-by-row into the R×C array. Since $K \leq R \cdot C$, there may be empty cells at the bottom of the array (i.e., one or more rows, or a portion thereof, may not include any bits).

In the second stage, the elements in each row are permutated (i.e., shuffled) based on a row permutation sequence specifically defined for that row. The intra-row permutation may be performed in a series of steps. In the first step, a base sequence c(i) of length p is generated. For each possible prime number p determined in the first stage, there is a primitive root, $g_0$, associated with that prime number, as defined by the W-CDMA standard and shown in Table 1. The base sequence c(i) is then derived as:

$$c(i)=[g_0 \cdot c(i-1)] \bmod (p), \text{ for } i=1, 2, \ldots, (p-1), \quad \text{Eq (1)}$$

where c(0)=1.

TABLE 1

| index | p | $g_0$ |
|---|---|---|
| 0 | 7 | 3 |
| 1 | 11 | 2 |
| 2 | 13 | 2 |
| 3 | 17 | 3 |
| 4 | 19 | 2 |
| 5 | 23 | 5 |
| 6 | 29 | 2 |
| 7 | 31 | 3 |
| 8 | 37 | 2 |
| 9 | 41 | 6 |
| 10 | 43 | 3 |
| 11 | 47 | 5 |
| 12 | 53 | 2 |
| 13 | 59 | 2 |
| 14 | 61 | 2 |
| 15 | 67 | 2 |
| 16 | 71 | 2 |
| 17 | 73 | 7 |
| 18 | 79 | 3 |
| 19 | 83 | 2 |
| 20 | 89 | 3 |
| 21 | 97 | 5 |
| 22 | 101 | 2 |
| 23 | 103 | 5 |
| 24 | 107 | 2 |
| 25 | 109 | 6 |

TABLE 1-continued

| index | p | $g_0$ |
|---|---|---|
| 26 | 113 | 3 |
| 27 | 127 | 3 |
| 28 | 131 | 2 |
| 29 | 137 | 3 |
| 30 | 139 | 2 |
| 31 | 149 | 2 |
| 32 | 151 | 6 |
| 33 | 157 | 5 |
| 34 | 163 | 2 |
| 35 | 167 | 5 |
| 36 | 173 | 2 |
| 37 | 179 | 2 |
| 38 | 181 | 2 |
| 39 | 191 | 19 |
| 40 | 193 | 5 |
| 41 | 197 | 2 |
| 42 | 199 | 3 |
| 43 | 211 | 2 |
| 44 | 223 | 3 |
| 45 | 227 | 2 |
| 46 | 229 | 6 |
| 47 | 233 | 3 |
| 48 | 239 | 7 |
| 49 | 241 | 7 |
| 50 | 251 | 6 |
| 51 | 257 | 3 |

In the second step of the second stage, a sequence of R prime numbers, $q_j$, is constructed. The elements of this prime number sequence are selected such that the following criteria are satisfied:

g.c.d. $\{q_j, p-1\} = 1$;

$q_j > 6$; and $q_j > q_{j-1}$,      Eq (2)

where g.c.d. is the greatest common divider and $g_0 = 1$.

The prime number sequence $q_j$ is essentially a sequence of increasing minimum prime numbers, which excludes prime numbers that are factors of (p-1). The R elements in this prime number sequence $q_j$ are respectively associated with the R rows of the array. Each of the R elements in the sequence $q_j$ is later used to compute an intra-row permutation sequence for the associated row, as described in further detail below.

Since elements at indices 0 through R-1 in the prime number sequence $q_j$ are respectively associated with rows 0 through R-1, and since the rows are subequently permutated with an inter-row permutation sequence $P_X$ after the intra-row permutation, the elements in the prime number sequence $q_j$ are also permutated using the same inter-row permutation sequence $P_X$. The sequence $P_X$ is selected for the code segment from four possible sequences, $P_A$, $P_B$, $P_C$, and $P_D$, as described in further detail below. The permutated prime number sequence $p_j$ is determined as:

$p_{P_X(j)} = q_j$, for j=0, 1, ... R-1.      Eq (3)

In the third step of the second stage, an intra-row permutation sequence $c_j(i)$ for each row is determined as follows:

$c_j(i) = c([i \cdot p_j]$ modulo (p-1)), for i=0, 1, ... (p-2),      Eq (4)

where $c_j(p-1) = 0$, j is the index of the row after the inter-row permutation, c(x) is the base sequence for the intra-row permutation and is computed above in equation (1), and $c_j(i)$ is the input bit position of the $i^{th}$ output after the permutation of the $j^{th}$ row. The intra-row permutation sequence $c_j(i)$ for each row is thus based on the base sequence c(x) and the prime number $p_j$ in the permutated prime number sequence associated with that row. Elements in each row are permutated such that the $i^{th}$ cell location in the permutated row is stored with the element stored in the $c_j(i)^{th}$ cell location in the original row.

As noted above, C can be equal to p-1, p, or p+1. Thus, the intra-row permutation sequence $c_j(i)$ is used as follows:

If C=p-1, use $c_j(i)-1$ for i=0, 1, 2, ... (p-2);

Else if C=p, use $c_j(i)$ for i=0, 1, 2, ... (p-2), and $c_j(p-1)=0$; and

Else if C=p+1, use $c_j(i)$ for i=0, 1, 2, ... (p-2), and $c_j(p-1)=0$, $C_j(p)=p$, and if R·C=K, then exchange $C_R-1(p)$ with $C_{R-1}(0)$.

In the third stage, the R rows in the array are permutated based on the inter-row permutation sequence $P_X$, which is selected from among four possible sequences, $P_A$, $P_B$, $P_C$, and $P_D$, defined by the W-CDMA standard as follows:

$P_A = \{19, 9, 14, 4, 0, 2, 5, 7, 12, 18, 10, 8, 13, 17, 3, 1, 16, 6, 15, 11\}$ $P_B = \{19, 9, 14, 1, 0, 2, 5, 7, 12, 18, 16, 13, 17, 15, 3, 1, 6, 11, 8, 10\}$ $P_C = \{9, 8, 7, 6, 5, 4, 3, 2, 1, 0\}$ $P_D = \{4, 3, 2, 1, 0\}$

The particular inter-row permutation sequence to use for the code segment is selected based on the following:

$P_A$ is selected if K belongs to [201, 480], [531, 2280], [2481, 3160], or [3211, 5114] bits.

$P_B$ is selected if K belongs to [2281, 2480] or [3161, 3210].

$P_C$ is selected if K belongs to [160, 200] or [481, 530] (i.e., K=10).

$P_D$ is selected if K belongs to [40, 155] (i.e., use $P_D$ whenever R=5).

The inter-row permutation is performed such that the $j^{th}$ row in the original array is moved to the $P_{Xj}$ row location in the permutated array.

After the inter-row permutation, the bits are read out column-by-column from top-to-bottom (i.e., from row 0 through row R-1). As noted above, since K≤R·C, some cells in the array may not contain valid data and these cells are skipped when reading out the data.

For clarity, an example is provided below for the above-described interleaving scheme. In this example, K=379 and results in a selection of R=20. The prime number p is then determined as p=19 and the number of column C is determine as C=19. For this prime number p, the associated primitive root $g_0=2$. Using equation (1), the base sequence c(i) is determined as:

c(i) = {1, 2, 4, 8, 16, 13, 7, 14, 9, 18, 17, 15, 11, 3, 6, 12, 5, 10}.

The prime number sequence $q_j$ is determined from equation set (2) as:

$q_j$ = {1, 7, 11, 13, 17, 19, 23, 29, 31, 37, 41, 43, 47, 53, 59, 61, 67, 71, 73, 79}.

For this K=379, the inter-row permutation sequence $P_A$ is selected. The permutated prime number sequence $p_j$ is generated from the prime number sequence $q_j$ based on the equality ($p_{PAj} = q_j$) to provide the following:

$p_j$ = {17, 61, 19, 59, 13, 23, 71, 29, 43, 7, 41, 79, 31, 47, 11, 73, 67, 53, 37, 1}.

The intra-row permutation sequence $c_j(i)$ for each row is then determined based on $p_j$ and the base sequence c(i). For the first row (j=0), the prime number for the row is $p_0=17$ and the intra-row permutation sequence, $c_0(i)$, is determined as:

$$c_0(i) = c(i - p_0 \text{ modulo } (p - 1))$$

$$= c(i \cdot 17 \text{ modulo } 18)$$

$$= \{1, 10, 5, 12, 6, 3, 11, 15, 17, 18, 9, 14, 7, 13, 16, 8, 4, 2, 0\}$$

The intra-row permutation sequence $c_j(i)$ for other rows can be determined in similar manner.

Turbo decoding is a computationally intensive process. For each Turbo encoded code segment, the transmitted coded bits are received and stored to a temporary storage unit (e.g., channel deinterleaver. 508 in FIG. 5). The coded bits are then (serially) retrieved from the temporary storage unit and decoded. For each bit to be decoded, the APP storage unit is accessed to retrieve APP data (i.e., APP symbols/extrinsic information) generated for this bit by a prior decoding (if any). The APP data generated for each decoded bit is further stored back to the APP storage unit for use by a subsequent decoding. The APP storage unit is thus continually accessed as bits in the code segment are decoded. Efficient memory management is essential for efficient Turbo decoding.

In accordance with an aspect of the invention, APP storage unit 520 is partitioned into, and implemented with, a number of banks. In an embodiment, the banks are assigned and operated in a manner to avoid double buffering of the APP data. In an embodiment, each bank may be accessed separately and independently from the other banks. This can be achieved by providing each bank with its own set of address and data lines.

In a specific embodiment, decoder 510 is designed with the capability to decode one information bit per clock cycle. To avoid having to wait for memory access (i.e., write and read) of APP data during the decoding process for each bit, the APP storage unit is designed with the capability to, on the average, store APP data for the current bit being decoded and provide APP data for a future bit to be decoded. To avoid access contention, the storage unit is partitioned such that write and read operations are not concurrently performed on the same bank on the same access cycle (although this may be possible if a multi-port memory is used). In an embodiment, for-ease of memory partitioning, the banks are further designed such that APP data for multiple bits may be written to multiple banks on a single access cycle, and APP data for multiple bits may be retrieved from multiple banks on another (e.g., alternate) access cycle.

In a specific embodiment, which is especially applicable for W-CDMA, the storage unit is partitioned into six banks, although a different number of banks may also be used. The banks are labeled as Bank0a, Bank0b, Bank1a, Bank1b, Bank2a, and Bank2b. Each bank is assigned a respective group of rows and set of columns of the R·C array in order to avoid access contention. Each bank is used to store the APP data for bits occupying those locations that are the intersection of the assigned group of rows and set of columns. As described above, APP data is written to storage unit 520 in interleaved order and retrieved from the storage unit in interleaved order (also referred to as the "interleaved" addressing mode) for the first constituent decoder. The APP data is written to and retrieved from the storage unit in linear order (also referred to as the "linear" addressing mode) for the second constituent decoder. To ensure that two different banks are accessed for two adjacent addresses in the linear addressing mode, the banks can be arranged and assigned such that one set of banks is assigned to even-numbered columns (e.g., which are associated with addresses having a zero ("0") for the least significant bit (LSB)), and another set of banks is assigned to odd-numbered columns (e.g., which are associated with addresses having a one ("1") for the LSB). With this odd/even assignment scheme, consecutive addresses (with LSBs of "0" and "1") are associated with two different sets of banks.

For the interleaved addressing mode, another bank assignment scheme is implemented. As described above, the code interleaving defined by the W-CDMA standard calls for reading the bits column-by-column from the R·C array. This results in different rows of the array being accessed when adjacent addresses are accessed during the interleaved addressing mode. To ensure that two different banks are accessed for two adjacent addresses in the interleaved addressing mode, the rows can be arranged into three or more groups such that the "adjacent" rows for the interleaved addressing mode are assigned to different groups. Adjacent rows are consecutive rows that may be accessed while writing/reading column-by-column in the interleaved addressing mode.

This row grouping may be achieved by first determining the adjacent rows for each row in the R·C array. For the $P_A$, $P_B$, and $P_C$ sequences used for the inter-row permutation described above, adjacent entries in these three sequences (which correspond to the row numbers) are assigned to different groups since adjacent rows may be accessed when writing/retrieving by column during the interleaved addressing mode. Also since $K \leq R \cdot C$, some of the rows toward the bottom of the array may be case the next row after the empty row is accessed. For all possible R, C, and K combinations supported by the W-CDMA standard, it was determined that row 17 may be partially skipped over, and rows 18 and 19 may be completely skipped over when the $P_A$ sequence is used, rows 18 and 19 may be skipped over when $P_B$ is used, and row 9 may be skipped over when $P_C$ is used.

Table 2 lists the "exclusion" rules to be followed in grouping the rows so that access contention may be avoided in the interleaved addressing mode. The first and third columns list the row number (in sequential order in Table 2). For each row identified in the first and third columns, the rows that should be excluded from the group that includes this row are listed in the second and fourth columns, respectively. For example, rows 1, 2, 4, 8, and 9 should be excluded from the group that includes row 0, rows 0, 2, 3, 6, and 16 should be excluded from the group that includes row 1, and so on.

TABLE 2

| Row | Exclusions | Row | Exclusions |
| --- | --- | --- | --- |
| 0 | 1, 2, 4, 8, 9 | 10 | 8, 9, 12, 18, 19 |
| 1 | 0, 2, 3, 6, 16 | 11 | 6, 8, 9, 15, 19 |
| 2 | 0, 1, 3, 5 | 12 | 7, 10, 16, 18 |
| 3 | 1, 2, 4, 13, 15, 17 | 13 | 3, 8, 16, 17 |
| 4 | 0, 3, 5, 14 | 14 | 4, 9 |
| 5 | 2, 4, 6, 7 | 15 | 3, 6, 11, 17 |
| 6 | 1, 5, 7, 11, 15, 16 | 16 | 1, 6, 12, 13, 18 |
| 7 | 5, 6, 8, 12 | 17 | 3, 13, 15 |
| 8 | 0, 7, 9, 10, 11, 13 | 18 | 10, 12, 16 |
| 9 | 0, 8, 10, 11, 14, 19 | 19 | 9, 10, 11 |

Table 3 lists a possible grouping of the rows such that the exclusion rules listed in Table 2 are observed. Other groupings may also be possible and are within the scope of the invention.

TABLE 3

| Group | Member Rows |
| --- | --- |
| 0 | 0, 3, 7, 10, 11, 14, 16 |
| 1 | 2, 4, 6, 8, 17, 18, 19 |
| 2 | 1, 5, 9, 12, 13, 15 |

Figure 6:
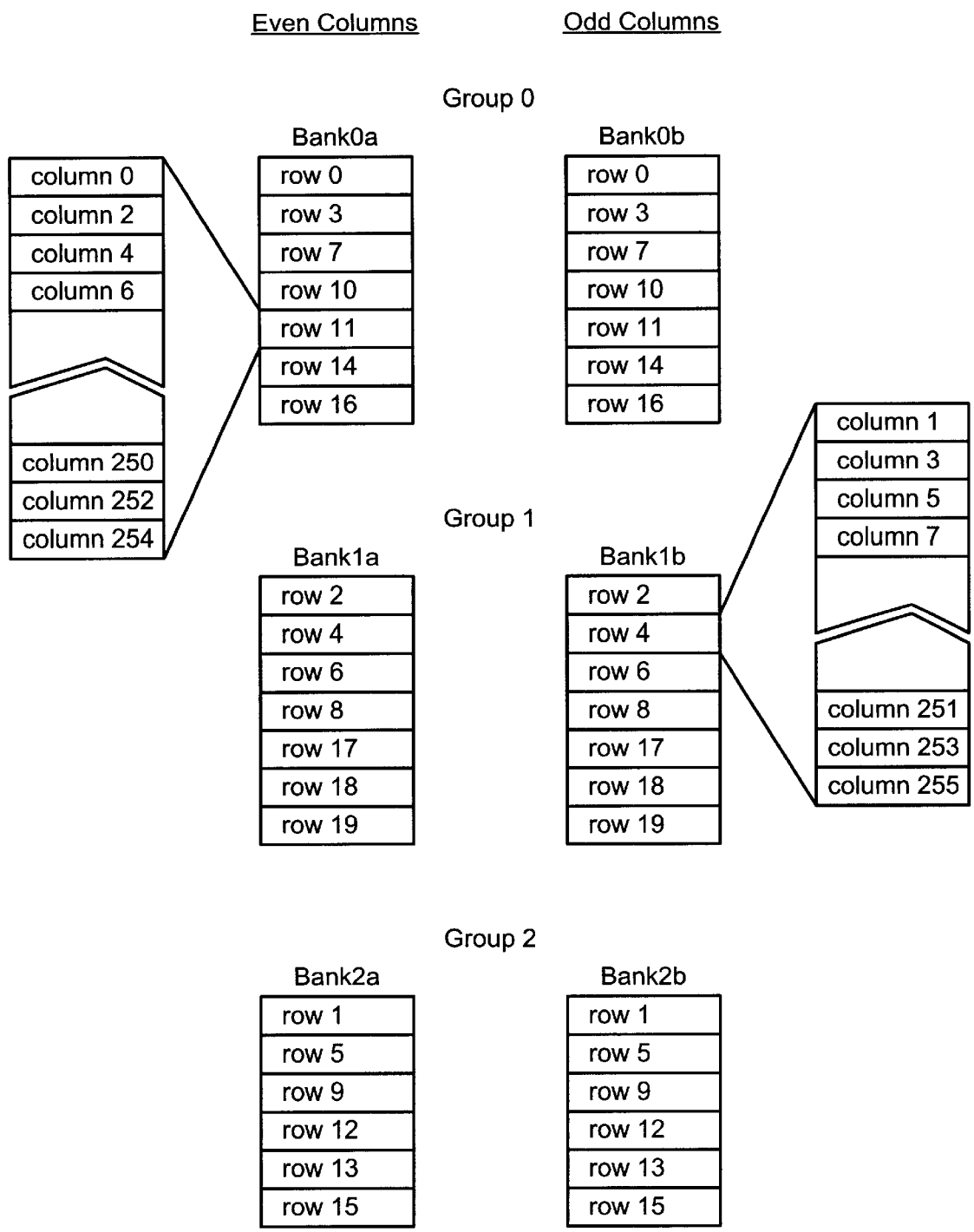
FIG. 6 is a diagram of an assignment of the rows and columns in an R·C array to six banks based on a specific row grouping.

FIG. 6 is a diagram of an assignment of the rows and columns in the R·C array to six banks based on the row grouping shown in Table 3. In this specific assignment scheme, the rows in groups 0, 1, and 2 in Table 3 are respectively assigned to Bank0v, Bank1v, and Bank2v, where v is either a or b. And as noted above, Bankua and Bankub are respectively assigned to even and odd numbered columns, where u is 0, 1, or 2. For each bank, each assigned row thus includes C/2 elements.

In the linear addressing mode, two banks from the same or different groups may be concurrently accessed (i.e., $Banku_1a$ and $Banku_1b$, or $Banku_1a$ and $Banku_2b$, may be accessed, where $u_1$ and $u_2$ may each be from any group). And in the interleaved addressing mode, two banks from different groups are concurrently accessed (i.e., $Banku_1a$ and $Banku_2a$, or $Banku_1a$ and $Banku_2b$, can be accessed).

In an embodiment, Bank0a, Bank1a, and Bank2a are used for even columns of even rows and odd columns of odd rows, and Bank0b, Bank1b, and Bank2b are used for odd columns of even rows and even columns of odd rows. This assignment scheme may be used to avoid access of the same bank in the linear addressing mode when the number of columns is odd. For example, if there are five columns, it may be desired to fetch data for row 1 of column 4 and row 2 of column 0 at the same time. Both are located in Bankua, provided row. 1 and row 2 are grouped together. The above assignment scheme avoids access contention.

The row grouping listed in Table 3 avoids access contention for the interleaved addressing mode when the $P_A$, $P_B$, or $P_C$ sequence is used for the inter-row permutation. For the $P_D$ sequence, Table 4 lists the exclusions for the five rows in the sequence, and Table 5 lists a possible grouping of the rows for $P_D$.

TABLE 4

| Row | Exclusions | Row | Exclusions |
| --- | --- | --- | --- |
| 0 | 1, 3, 4 | 3 | 0, 2, 4 |
| 1 | 0, 2 | 4 | 0, 3 |
| 2 | 1, 3 | | |

TABLE 5

| Group | Member Rows |
| --- | --- |
| 0 | 0 |
| 1 | 1, 3 |
| 2 | 2, 4 |

It can be noted that the grouping shown in Table 3 violates the exclusion rules for rows 0 and 3 of the $P_D$ sequence, as shown in Table 4. Thus, a row grouping different from that shown in Table 3 may be generated to avoid access contention for all four sequences, $P_A$, $P_B$, $P_C$, and $P_D$, in the interleaved addressing mode. Alternatively, the row grouping shown in Table 3 may be used whenever the $P_A$, $P_B$, or $P_C$ is selected, and the row grouping shown in Table 5 may be used whenever the $P_D$ is selected.

Figure 7:
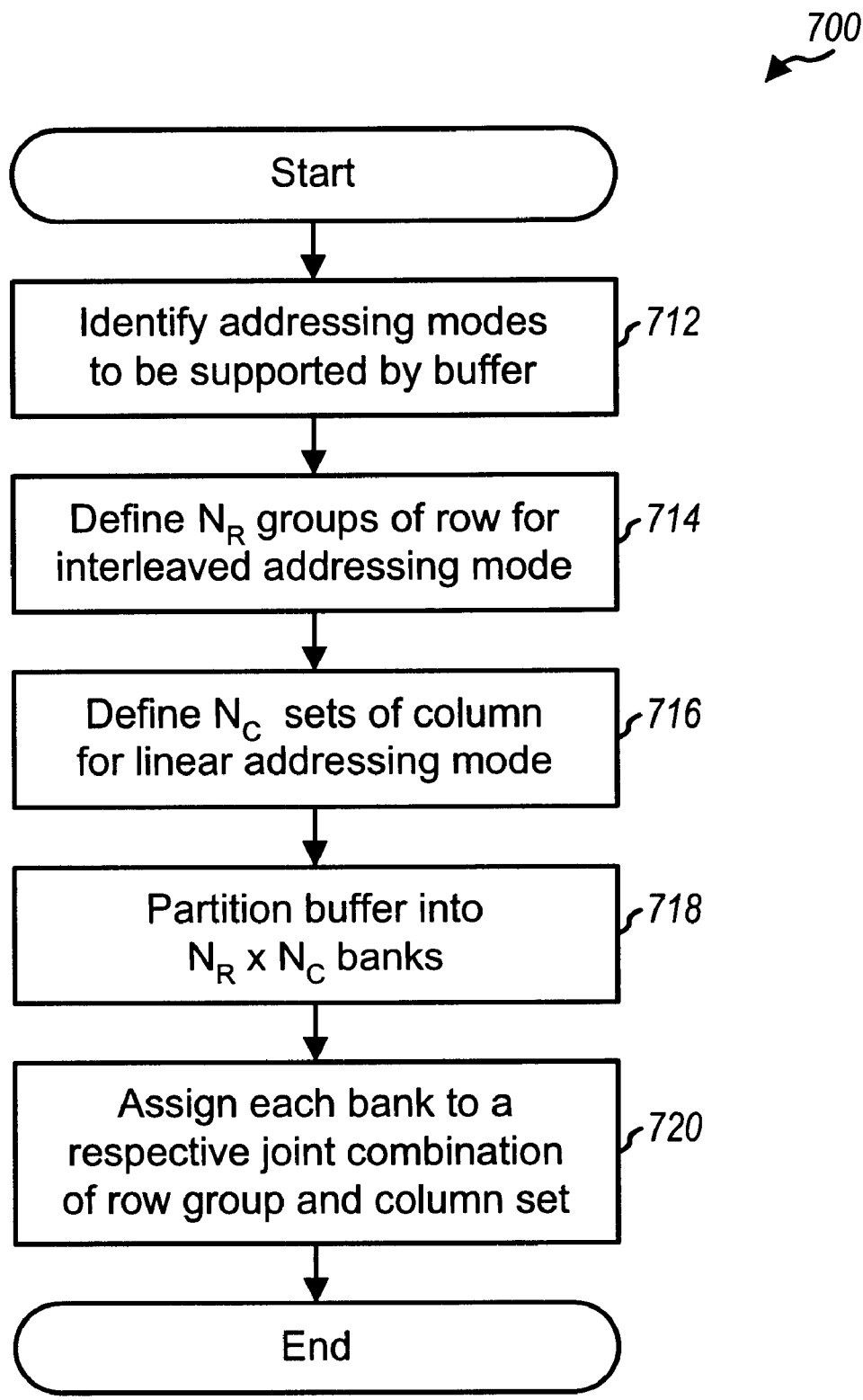
FIG. 7 is a flow diagram of an embodiment of a process for defining a buffer structure for storing intermediate results for the Turbo decoder.

FIG. 7 is a flow diagram of an embodiment of a process 700 for defining a buffer structure (e.g., for APP storage unit 520) for storing intermediate results (e.g., APP data) for a Turbo decoder. Initially, the addressing modes to be supported by the buffer are identified, at step 712. For Turbo decoding, the APP data may be accessed via an interleaved addressing mode and a linear addressing mode. Each constituent decoding provides APP symbols corresponding to the information bits in a data packet. In the interleaved addressing mode, APP symbols are accessed at (i.e., written to and retrieved from) interleaved locations in the packet. And in the linear addressing mode, APP symbols are accessed at linear locations in the packet.

At step 714, $N_R$ groups of row are defined, where $N_R \geq 2$. Each group includes one or more rows of the R·C array used to interleave information bits in the data packet for Turbo encoding. The rows are selected for inclusion in each group such that two consecutive addresses to be accessed during the interleaved addressing mode are from two groups. For the above example, three groups are defined, with each group including a respective collection of rows in the array. The groups are defined based on the possible inter-row permutation sequences defined by the code interleaving scheme associated with the Turbo encoding.

At step 716, $N_C$ sets of column are defined, where $N_C \geq 2$. Each set includes one or more columns of the R·C array. The columns are selected for inclusion in each set such that two consecutive addresses to be accessed during the linear addressing mode are from two sets. For the above example, two sets are defined, with the first set including even-numbered columns and the second set including odd-numbered columns.

The buffer is then partitioned into $N_R \cdot N_C$ banks, at step 718. Each bank is then assigned to a respective one of the $N_R \cdot N_C$ joint combinations of row group and column set, at step 720. For the above example, six banks are defined and assigned to the six joint combinations of three groups of rows and two sets of columns, as described above.

Figure 8:
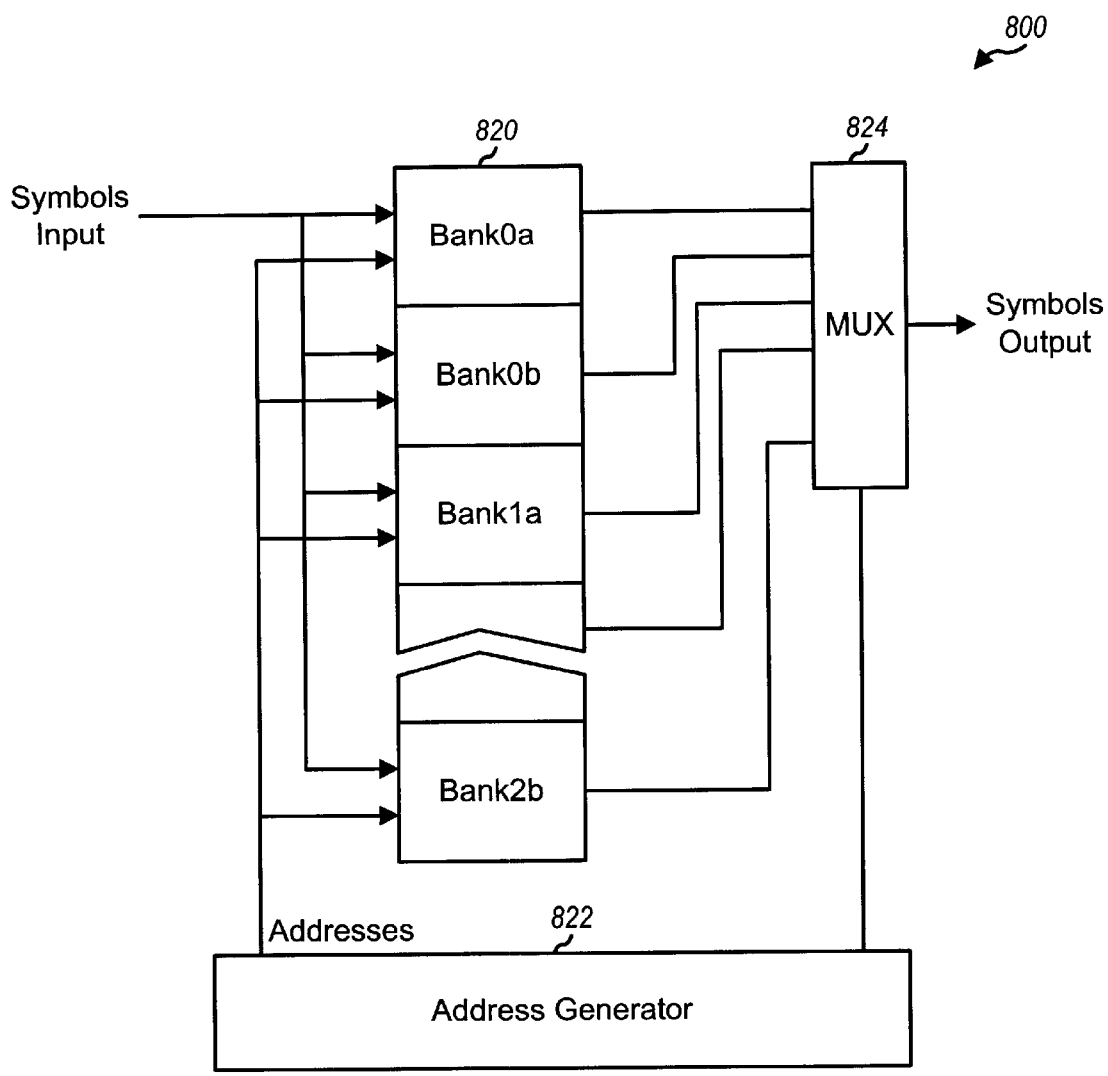
FIG. 8 is a block diagram of an embodiment of a buffer architecture that may be used to implement the APP storage unit shown in FIG. 5.

FIG. 8 is a block diagram of an embodiment of a buffer architecture 800 that may be used to implement the APP storage unit. Buffer architecture 800 includes a memory unit 820 for implementing the APP storage unit, an address generator 822 for generate the necessary addresses for each access cycle, and a multiplexer 824 for selecting output data from the banks.

In the embodiment shown in FIG. 8, memory unit 820 is partitioned into six banks, with each bank being assigned to a respective section of the memory unit. In an embodiment, each bank receives a set of address lines, which allows the bank to be individually and independently accessed. Although not shown in FIG. 8 for simplicity, each bank is typically provided with a respective "chip select" line that allows the bank to be individually selected.

To write two symbols to two banks on each write cycle, each bank is configured to receive two symbols on two sets of data lines, select one of the symbols (e.g., via multiplexer not shown in FIG. 8) and, if directed by address generator 822, stores the selected symbol to a location indicated by the bank's address lines. Address generator 822 provides two addresses for the two symbols to be stored, and these addresses are provided to two banks via their address lines.

To retrieve two symbols from two banks on each read cycle, a multiplexer 824 receives the output symbols from all six banks, selects two of the received symbols as directed by a control signal from address generator 822, and provides the selected symbols. Although not shown in FIG. 8, multiplexer 824 may be implemented with two 6×1 multiplexers, and each 6×1 multiplexer may be operated to provide one of the output symbols. Again, address generator

822 provides two addresses for the two symbols to be retrieved, and these addresses are provided to two banks via their address lines.

For clarity, the implementation of the APP storage unit using multiple banks has been described for a specific code interleaving scheme defined by the W-CDMA standard. Each CDMA standard may define a code interleaving scheme that is different from that of other CDMA standards, including the W-CDMA standard. For example, the cdma2000 standard defines an interleaving scheme whereby the rows are permutated in accordance with a bit-reversal rule, e.g., row 1 ("00001") is swapped with row 16 ("10000"), row 3 ("00011") is swapped with row 24 ("11000"), and so on. For these different code interleaving schemes, the groups of rows to be associated with the banks are likely to be different from that described above for the interleaving scheme defined by the W-CDMA standard.

Also for clarity, various aspects of the invention have been specifically described for the downlink Turbo code in the W-CDMA system. These techniques may also be used for the uplink Turbo code in the W-CDMA system (especially since they are the specified to be the same by the W-CDMA standard).

Depending on the Turbo interleaver, the APP storage unit may be implemented with less than six banks. As mentioned above, the restriction that certain rows cannot be in the same group with a particular row leads to the use of six banks. These restrictions stem from the "block" interleaver structure and the fact that the bottommost three rows of the R·C array may be partially unfilled. If R can be chosen such that only the bottommost row is partially unfilled, then some of the exclusion restrictions disappear and the APP storage may be implemented with only four banks. The APP storage unit may also be implemented with more than six banks. For example, the storage unit may be implemented with one bank for each row of the array, or one bank for each group of one or more rows. Generally, more banks may allow for concurrent access (i.e., write and/or read) of more symbols. However, the hardware complexity typically increases correspondingly with the number of banks. More data and address lines and multiplexers are likely to be needed to support concurrent access of more banks.

The implementation of the APP storage unit using multiple banks provides numerous advantageous. First, faster decoding time may be achieved since APP data for multiple bits may be stored/retrieved on each clock cycle. Access of the APP storage may thus not be the bottleneck for the Turbo decoding. Second, slower memory designs and/or processes may be used to implement the APP storage unit. The multi-bank design in combination with parallel access capability may allow a slower memory to provide the same throughput as a faster memory design having less parallelism.

The APP storage unit may be implemented with various memory structures. For example, each bank of the storage unit may be implemented using one or more memory units, with a multi-port memory unit, with a memory unit that comprises of, or is partitioned into, a number of memory banks, or with other structures. The storage unit may also be implemented with various memory technologies such as, for example, random access memory (RAM), dynamic RAM (DRAM), Flash memory, and others. Various structures and implementations of the storage unit are possible and within the scope of the present invention.

The address generation may be implemented with software, hardware, or a combination thereof. For a hardware implementation, the address generator may be (1) implemented as a separate unit, (2) integrated within a controller or the storage unit, (3) implemented within an ASIC that also includes other processing elements, or via some other design. The address generator may include a data structure used to store information descriptive of the banks. The data structure may further store information used to manage the operation of the banks.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A buffer structure for storing intermediate results for a Turbo decoder, comprising:
   a plurality of banks configured to store symbols representative of the intermediate results, wherein each bank is associated with one of a plurality of groups of one or more rows of a 2-dimensional array used to interleave information bits in a packet for a corresponding Turbo encoder, and wherein the rows are selected for inclusion in each group such that two or more symbols are concurrently accessible from two or more banks for each access cycle of the buffer structure.

2. The buffer structure of claim 1, wherein the plurality of banks are arranged into first and second sets, and wherein the first set of banks is associated with even-numbered columns in the 2-dimensional array, and wherein the second set of banks is associated with odd-numbered columns in the 2-dimensional array.

3. The buffer structure of claim 1, wherein the plurality of banks are configured to store the symbols in an interleaved order.

4. The buffer structure of claim 1, wherein the plurality of banks are accessible via an interleaved addressing mode or a linear addressing mode for a particular access cycle.

5. The buffer structure of claim 4, wherein the interleaved addressing mode corresponds to access of symbols at interleaved locations in the packet, and wherein the linear addressing mode corresponds to access of symbols at linear locations in the packet.

6. The buffer structure of claim. 4, wherein rows are selected for inclusion in each group such that two or more consecutive addresses to be accessed during the interleaved addressing mode are from two or more groups.

7. The buffer structure of claim 1, wherein the symbols are provided to, and retrieved from, the plurality of banks in interleaved order during decoding of a first constituent code of the Turbo encoder.

8. The buffer structure of claim 1, wherein the symbols are provided to, and retrieved from, the plurality of banks in linear order during decoding of a second constituent code of the Turbo encoder.

9. The buffer structure of claim 1, wherein the symbols are provided to, and retrieved from, the plurality of banks in linear order during decoding of a first constituent code of the Turbo encoder, and wherein the symbols are provided to, and retrieved from, the plurality of banks in interleaved order during decoding of a second constituent code of the Turbo encoder.

10. The buffer structure of claim 1, wherein the plurality of banks are configured to store or provide two or more symbols for each access cycle.

11. The buffer structure of claim 1, wherein the plurality of banks are operated such that only one type of access operation, either a write or a read, is performed on any particular access cycle.

12. The buffer structure of claim 1, wherein the rows are grouped based at least in part on one or more possible inter-row permutation sequences used for a code interleaving scheme associated with the Turbo encoder.

13. The buffer structure of claim 1, and including at least four banks.

14. The buffer structure of claim 1, and including six banks.

15. The buffer structure of claim 1and, further comprising:

a local memory operatively coupled to the plurality of banks and configured to store a priori probability (APP) data for a plurality of information bits to be decoded by the Turbo decoder.

16. The buffer structure of claim 15, wherein the APP data is formed from log-likelihood ratios (LLRs) for the information bits to be decoded and corresponding extrinsic information for the information bits.

17. The buffer structure of claim 1, further comprising:

an address generator coupled to the plurality of banks and operative to provide addresses for accessing the plurality of banks.

18. The buffer structure of claim 1, and configured to store symbols based on a coding interleaving scheme for the Turbo encoder defined by W-CDMA standard.

19. A Turbo decoder comprising:

a constituent decoder configured to receive and decode coded bits in accordance with a particular constituent code; and a buffer coupled to the constituent decoder and configured to store symbols representative of intermediate results for the Turbo decoder, wherein the buffer includes a plurality of banks, wherein each bank is associated with one of a plurality of groups of one or more rows of a 2-dimensional array used to interleave information bits in a packet for a corresponding Turbo encoder, wherein the rows are selected for inclusion in each group such that two or more symbols are concurrently accessible from two or more banks for each access cycle of the buffer.

20. The Turbo decoder of claim 19, wherein the plurality of banks are arranged into first and second sets, and wherein the first set of banks is associated with even-numbered columns in the 2-dimensional array, and wherein the second set of banks is associated with odd-numbered columns in the 2-dimensional array.

21. The Turbo decoder of claim 19, further comprising:

a local memory unit operatively coupled to the buffer and the constituent decoder and configured to store a priori probability (APP) data for a plurality of information bits to be decoded by the constituent decoder.

22. A method for defining a buffer structure used to store intermediate results for a Turbo decoder, the method comprising:

identifying a plurality of addressing modes supported by the buffer structure, wherein the plurality of supported addressing modes include an interleaved addressing mode and a linear addressing mode, wherein the interleaved addressing mode corresponds to access of symbols at interleaved locations in a packet to be decoded, and wherein the linear addressing mode corresponds to access of symbols at linear locations in the packet;

defining two or more ($N_R$) groups of row, wherein each group includes one or more rows of a 2-dimensional array used to interleave information bits in the packet for a corresponding Turbo encoder, and wherein the rows are selected for inclusion in each group such that two or more consecutive addresses to be accessed during the interleaved addressing mode are from two or more groups;

defining two or more ($N_C$) sets of column, wherein each set includes one or more columns of the 2-dimensional array, and wherein the columns are selected for inclusion in each set such that two or more consecutive addresses to be accessed during the linear addressing mode are from two or more sets;

partitioning the buffer structure into a plurality of ($N_R \cdot N_C$) banks; and assigning each of the $N_R \cdot N_C$ joint combinations of group of rows and set of columns to a respective one of the plurality of banks.

23. The method of claim 22, wherein the rows are grouped based at least in part on one or more possible inter-row permutation sequences used for a code interleaving scheme associated with the Turbo encoder.

* * * * *